United States Patent [19]

Ames et al.

[11] 4,080,816

[45] Mar. 28, 1978

[54] PROCESS AND DEVICE FOR MANUFACTURING EXTRUDED SECTIONS AND SIMILAR ITEMS WHICH ARE MADE IN PARTICULAR OUT OF LIGHT WEIGHT METAL

[75] Inventors: Adolf Ames, Hilzingen, Germany; Jean-Jacques Theler, Neunkirch, Switzerland

[73] Assignee: Swiss Aluminium Ltd., Neuhausen am Rheinfall, Switzerland

[21] Appl. No.: 594,034

[22] Filed: Jul. 8, 1975

[30] Foreign Application Priority Data

Jul. 17, 1974 Germany ............................ 2434299

[51] Int. Cl.² ...................... B21C 23/04; B21C 23/14; B21C 25/04; B21C 35/00
[52] U.S. Cl. .................................... 72/253 R; 72/261; 72/269; 425/114; 425/382 R; 425/464; 425/115
[58] Field of Search ................. 72/253, 261, 264, 268, 72/269; 425/113, 114, 382 R, 464, 466, 115; 264/176 R

[56] References Cited

U.S. PATENT DOCUMENTS

| 2,826,782 | 3/1958 | Dugall et al. ............... 425/114 X |
| 3,090,182 | 5/1963 | Johnson et al. .............. 425/12 DM |
| 3,150,217 | 9/1964 | Shanok et al. ............... 425/114 X |
| 3,490,098 | 1/1970 | Frohlich ........................ 425/114 |

FOREIGN PATENT DOCUMENTS 109,001  3/1900  Germany ............................ 72/261

Primary Examiner—E. M. Combs
Assistant Examiner—D. M. Gurley
Attorney, Agent, or Firm—Ernest F. Marmorek

[57] ABSTRACT

This concerns a process for manufacturing extrusion sections made of a light weight metal, using an extrusion tool with a single hole die, whereby several extrusions are produced simultaneously using a common single hole in the die. The device for carrying out the process allows a movable steel strip to pass through the common die hole this dividing it up into separate extrusion chambers.

8 Claims, 4 Drawing Figures

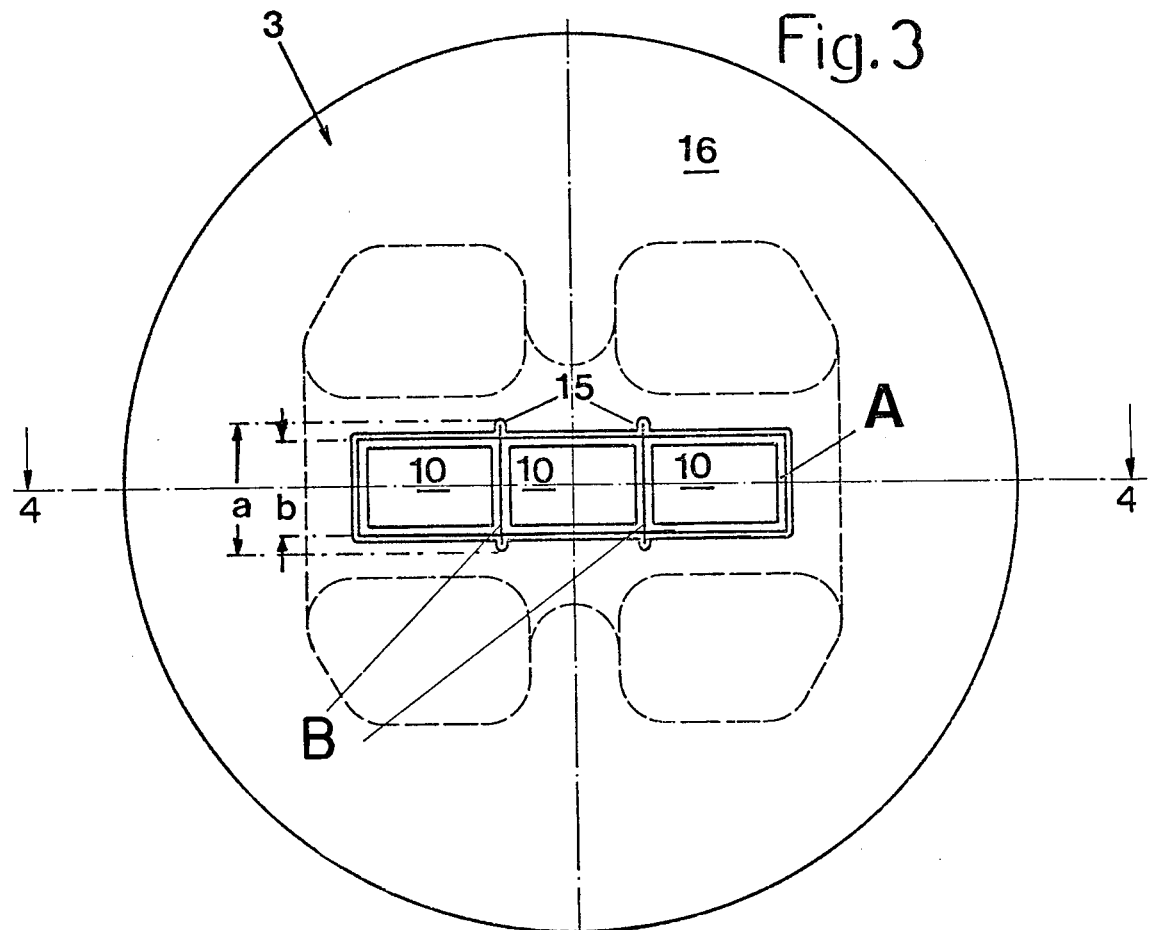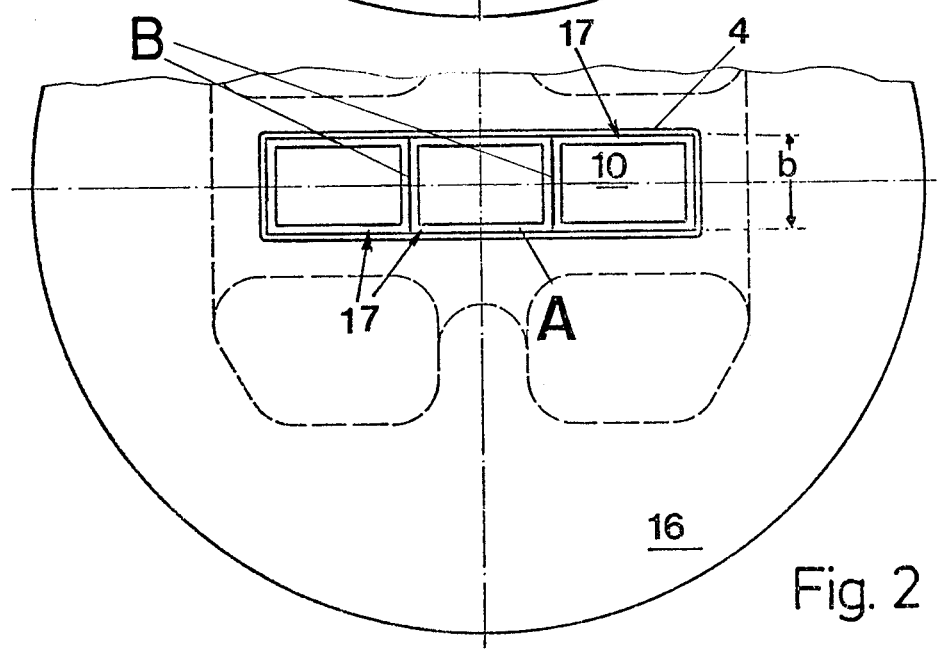

PROCESS AND DEVICE FOR MANUFACTURING EXTRUDED SECTIONS AND SIMILAR ITEMS WHICH ARE MADE IN PARTICULAR OUT OF LIGHT WEIGHT METAL

CROSS-REFERENCE TO RELATED APPLICATIONS

Reference is hereby made to the following co-pending companion applications: Ser. No. 564,997 by Ames and Wagner; Ser. No. 617,070 by Ames; and Ser. No. 594,040 by Ames and Theler.

SUMMARY OF THE INVENTION

The invention concerns a process for manufacturing extruded sections or similar items which are in particular made out of light weight metal, by means of an extrusion press tool which has a single hole extrusion die, and also concerns a device for carrying out the said process.

Such extrusion tools with a single hole in the die have the disadvantage that only one section at a time can be extruded; if several sections are to be extruded with the one tool then several holes in the die are necessary. These holes must be arranged far enough from each other that the parts of the die remaining between the holes are sufficiently strong to prevent the die from cracking or failing in these places.

The object of the invention is to produce a process and a device of the kind described at the beginning, with which the stated difficulties, which are encountered in normal extrusion practice or in extrusion tools, are removed.

In solving this problem the idea was developed to produce several extrusions at the same time in a common, single hole of the die, whereby at least one dividing wall is fed through the common single hole of the die with the stream of metal.

According to another feature of the invention the dividing wall, which is more or less in the form of a strip, runs in the direction of extrusion and transverse to the long axis of the die hole, and thus divides up the hole into several chambers, i.e. each strip produces two such chambers and the number of strips used determines the number of shaping chambers in the common die hole.

Thus one can with a single hole die and these moving dividing walls, carry out multiple section extrusion in a very simple way. The dividing walls can be of inexpensive packaging strip, which is discarded after use or can be in the form of an endless strip which runs repeatedly through the die. In its function as a dividing wall the steel strip must not make any metallic bond with the extruded metal. The dividing wall which moves with the stream of metal then, in terms of the invention, remains separate from that metal on both sides.

In order to achieve an effective separation of the individual extruded sections from each other, it has been found to be particularly favourable to choose dividing walls or strips a little broader than the width of the die-hole and to provide approximately parallel grooves or channels in the side walls at the hole in the extrusion tool to allow these strips to be fed into the die interior. These grooves extend into the region of the feed-in channels for the dividing walls or strips in the extrusion tool of the invention. The feed-in channels are formed by a groove in the tool and the entry plate, which is a component of the tool. The grooves should preferably be in a part of the tool called the mandrel plate, and should then taper down into the hole in the die approximately parallel to the tool.

According to a further feature of the invention, the grooves — and therefore the feed-in channels — are so designed that they intercept the normally approximately cylindrical tool at the side wall; the feeding-in of the dividing walls or strips ensures only brief heating of these moving parts and therefore results in a long lifetime. Also, this arrangement allows altogether better handling than can be achieved with extrusion tools in which strips run through, parallel to the axis.

An additional possible variation is that the rate of throughput of the moving dividing walls can be varied; thus it is conceivable to make these walls move slightly faster or slower than the stream of metal being extruded, in order to exclude the possibility of even brief adhesion of the matrix to the strip or similar component. Furthermore, by this means the structure at the surface of the extruded section can be influenced and controlled.

Usefully therefore more extrusions can be produced simultaneously in a container of specific diameter in the way described, than has been possible up to now; the space required for separating the individual metal streams, and the multiple holes in the die disappear, with the result that the extrusion ratio is reduced and with it the extrusion pressure which is required.

Further advantages, features and details of the invention can be seen from the following description of preferred embodiments and from the drawings viz., FIG. 1 is an extended view partially in section of an extrusion tool according to the instant invention;

FIG. 2 is a fragmentary large scale plan view of the tool shown in FIG. 1;

FIG. 3 is a fragmentary large scale plan view similar to FIG. 2, of a modification of the instant invention.

Figure 1:
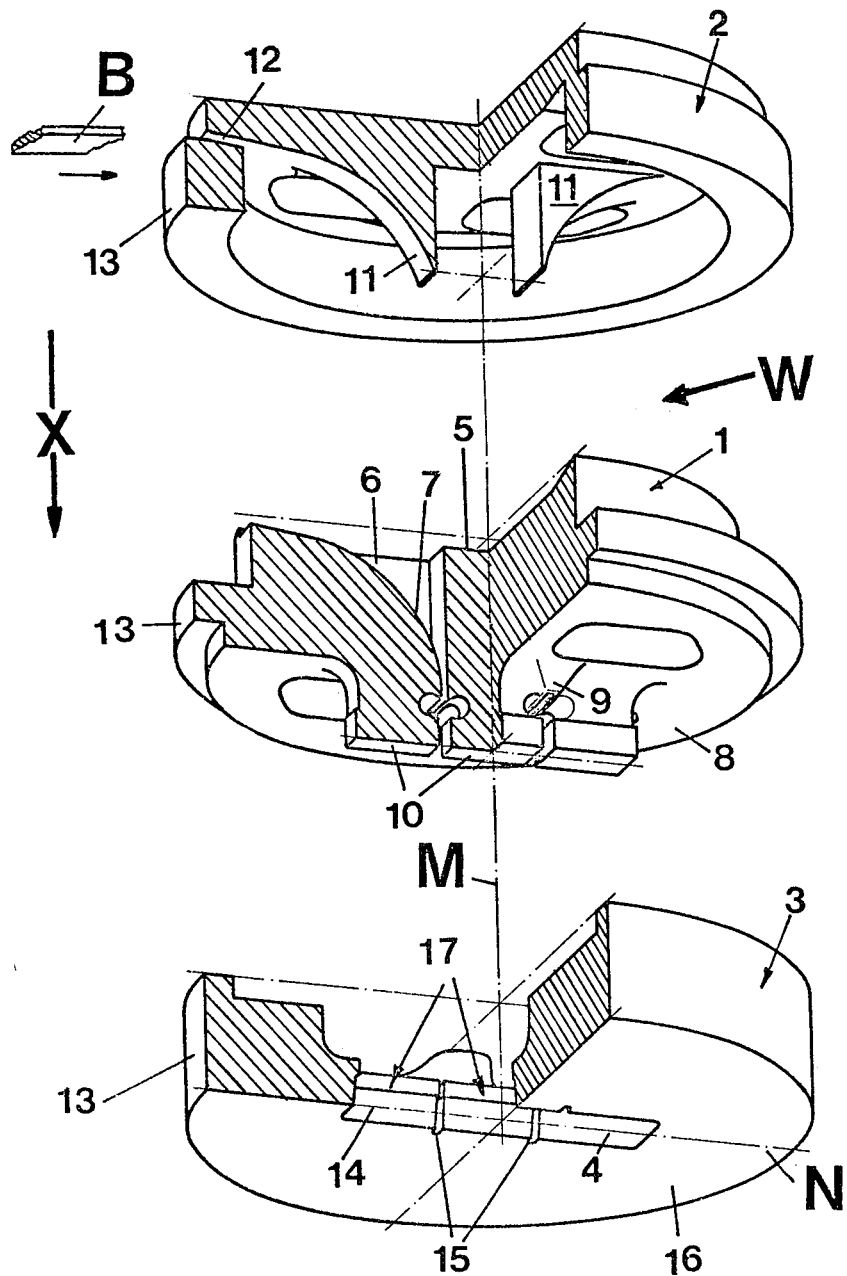
Figure 4:
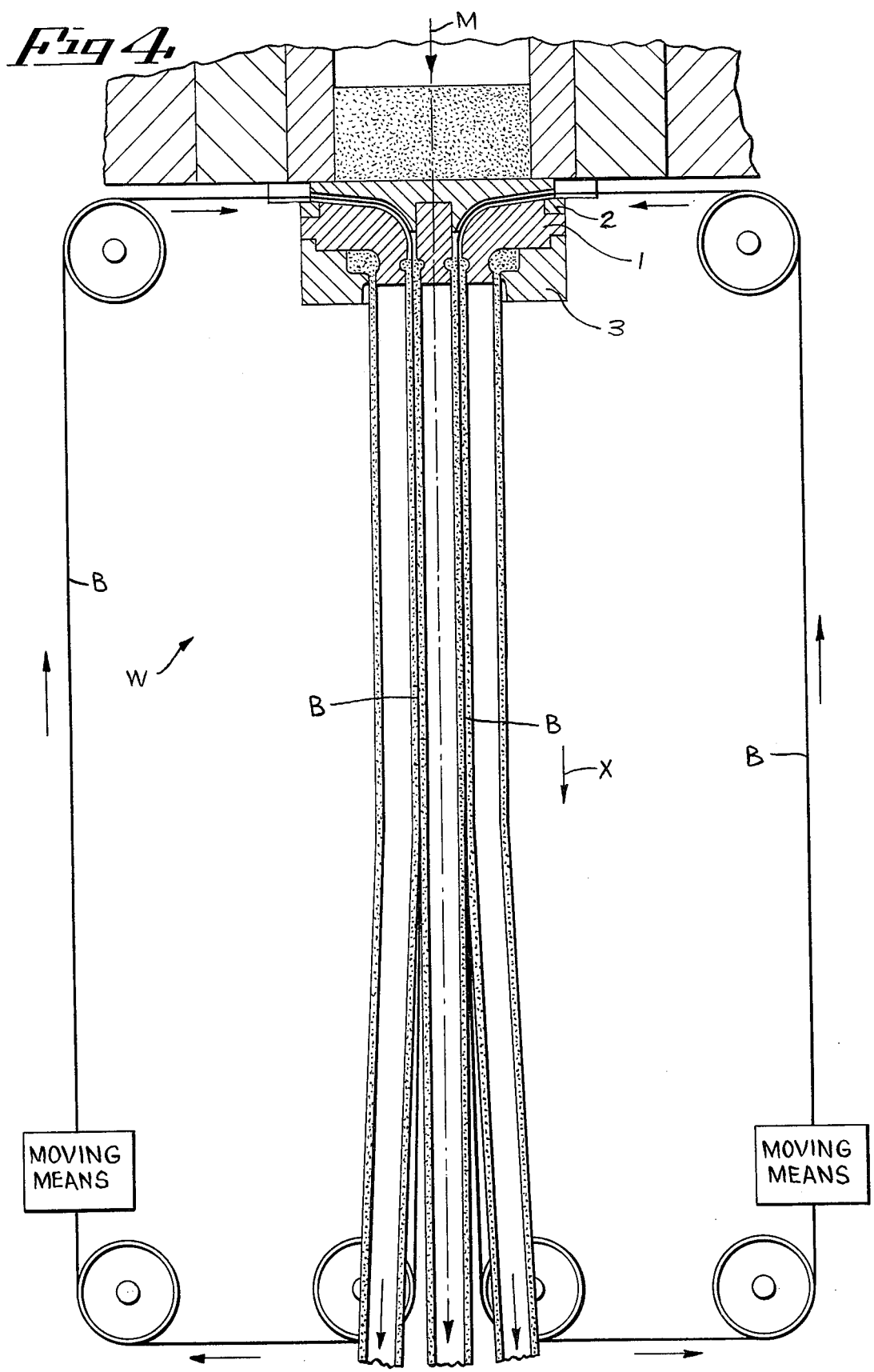
FIG. 4 is a fragmentary sectional view taken along line 4—4 of FIG. 3.

An extrusion tool W for simultaneous extrusion of several hollow sections has on one side of a mandrel plate 1 an entry plate 2, and on the other side a die plate 3 with a central hole 4. In the surface 5 of the mandrel plate 1 facing the entry plate 2 there are, lying on the same diametric line, two grooves 6 with surfaces 7 curving in towards the tool axis M. They terminate at the other face 8 of the mandrel plate 1 as exit openings 9 between three projections 10 in the mandrel plate 1.

The entry plate 2 is provided with projections 11 which, when the entry plate 2 and the mandrel plate 1 are assembled, fit into the grooves 6 and thus form guiding channels; these are extended further to the outside wall 13 of the tool W by the radial slit 12 in the entry plate 2.

The principle axis N of the hole 4 in the die plate 3 is perpendicular to the exit openings 9 and can in length either be larger than the width b of the die hole 4 (FIG. 3) or can be the same size. In the first mentioned case the exit openings 9 of the guide channels are made to fit into the grooves 15 which are formed in the side wall 14 of the die hole 4 and which lie approximately parallel to the tool axis M and are thereby extended to the front face 16 of the die plate.

At least during extrusion, in each guide channel or depending on the requirements in only one of them, there is introduced a strip B which is pushed with the stream of metal being extruded, in the extrusion direction X. As a result of this the strip B divides the die hole 4 into two separate openings 17.

One may introduce either loose strips B or strips in ring form which are always used with the tool and are changed only when worn.

The strips B, which are of inexpensive packaging strips or similar material with metallic non covered surfaces, pass through the die hole 4 with the matrix metal A which is being extruded, without bonding to it. The rate of throughput of the strips B can be the same as the rate of extrusion.

Hollow sections are produced using extrusion tools which have the mandrel head 10 shown in the drawing; if one wishes to extrude several full sections simultaneously the mandrel heads 10 are not used.

What we claim is:

1. In an extrusion device for manufacturing extruded metal sections by extrusion of a stream of metal, and including a die plate defining a single die hole;
   the improvement comprising
   at least one substantially flat and smooth metal band positioned to divide said die hole into sectors, whereby several extruded metal sections can be formed at one time one in each sector;
   guide means operable to guide said metal band through said die hole; and
   moving means operable to move said metal band through said die hole in the direction of the extrusion of the metal, at a speed independently variable with respect to the speed of extrusion of the metal.

2. In an extrusion device as claimed in claim 1, wherein said metal band is in the form of a continuous metal loop; and
   said guide means includes channel means operable to pass said band therethrough whereby extruded metal sections adjacent opposite sides of said band are kept separate from one another when passing through said die hole.

3. In an extrusion device as claimed in claim 2, wherein said guide means comprise at least one guiding channel defined through said device and at least one slot defined in a wall of said die hole, said guiding channel being operable to be aligned with said slot.

4. In an extrusion device as claimed in claim 3, wherein said guiding channel is formed by a groove having an exit opening facing said die hole, and said device includes a top part forming an upper wall of said groove.

5. In an extrusion device as claimed in claim 3, wherein there are two said slots defined in the wall of said die hole and spaced apart from each other, two said guiding channels and two said continuous metal band loops, whereby said single die hole can simultaneously extrude three metal sections.

6. In an extrusion device, as claimed in claim 5, wherein each said guiding channel is formed by a groove having an exit opening facing said die hole, and said device includes a top part forming an upper wall for both said grooves.

7. In extrusion device, as claimed in claim 6, said exit openings being so symmetrically disposed with respect to each other and to the die hole as to result in the extrusion of three substantially equal metal sections.

8. In a process for manufacturing extruded metal sections by extruding a stream of metal through an extrusion device including a die plate defining a single die hole through which the metal stream is extruded;
   the steps of:
   passing at least one substantially flat metal band through said die hole whereby said die hole is divided into at least two sectors;
   simultaneously extruding the stream of metal through the extrusion device whereby at least two metal sections are simultaneously formed, and wherein said metal band is passed through the die hole at a speed independent of the speed at which the metal is extruded: and
   thereafter, separating said metal band from the extruded metal sections.

* * * * *